(12) United States Patent
Lin et al.

(10) Patent No.: US 10,608,020 B2
(45) Date of Patent: Mar. 31, 2020

(54) DISPLAY PANEL

(71) Applicant: Au Optronics Corporation, Hsinchu (TW)

(72) Inventors: Cheng-Te Lin, Hsinchu (TW); Ya-Hua Lee, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 34 days.

(21) Appl. No.: 16/143,429

(22) Filed: Sep. 26, 2018

(65) Prior Publication Data

US 2019/0305000 A1    Oct. 3, 2019

(30) Foreign Application Priority Data

Apr. 3, 2018    (TW) .............. 107111987 A

(51) Int. Cl.
*H01L 27/12* (2006.01)
*H01L 25/16* (2006.01)
*G09G 3/32* (2016.01)

(52) U.S. Cl.
CPC .......... *H01L 27/124* (2013.01); *H01L 25/167* (2013.01); *G09G 3/32* (2013.01); *G09G 2300/08* (2013.01); *G09G 2310/08* (2013.01)

(58) Field of Classification Search
None
See application file for complete search history.

(56) References Cited

U.S. PATENT DOCUMENTS

| 9,196,606 | B2 | 11/2015 | Oraw |
| 9,577,007 | B2 | 2/2017 | Blanchard et al. |
| 9,881,544 | B2 | 1/2018 | Qing et al. |
| 2003/0122502 | A1* | 7/2003 | Clauberg ........... H05B 33/0818 315/291 |
| 2006/0113551 | A1 | 6/2006 | Kwak |
| 2015/0116191 | A1 | 4/2015 | Qi et al. |
| 2015/0356918 | A1 | 12/2015 | Sakariya et al. |

FOREIGN PATENT DOCUMENTS

| CN | 1779763 | 5/2006 |
| CN | 101645452 | 2/2010 |
| CN | 103000132 | 3/2013 |
| CN | 203674215 | 6/2014 |
| CN | 103531149 | 7/2015 |
| CN | 103413519 | 5/2016 |
| CN | 106876552 | 6/2017 |

* cited by examiner

*Primary Examiner* — Anthony Ho
*Assistant Examiner* — Kevin Quinto
(74) *Attorney, Agent, or Firm* — JCIPRNET

(57) ABSTRACT

A display panel includes a substrate and a plurality of display dies. The display die is disposed on the substrate and includes a first source pad, a second source pad, a first common pad, a second common pad, a first gate pad, a second gate pad, a first transistor, a first LED, and a second LED. The first and second source pads are respectively disposed on the first and second sides of a circuit region. The first common pad and the first gate pad are disposed on the third side of the circuit region. The second common pad and the second gate pad are disposed on the fourth side of the circuit region. The first transistor is electrically connected to the first gate pad and the first common pad. The first and second LEDs are electrically connected between the first source pad and the first transistor.

14 Claims, 6 Drawing Sheets

DISPLAY PANEL

CROSS-REFERENCE TO RELATED APPLICATION

This application claims the priority benefit of Taiwan application serial no. 107111987, filed on Apr. 3, 2018. The entirety of the above-mentioned patent application is hereby incorporated by reference herein and made a part of this specification.

BACKGROUND

Field of the Disclosure

The disclosure is related to a display panel, and particularly to a display panel that is formed by transferring a light emitting diode die onto a substrate.

Description of Related Art

Currently, since micro light emitting diode (μLED) display panel has the following advantages such as driving pixel independently, more power-saving, faster responding time, greater brightness, high color saturation and so on, such display panel has become the focus in the development of display panel in next generation. However, since μLED has to be connected with transistor served as a switch, deterioration of the transistor directly affects the light-emitting effect of the μLED, or a complex circuit is designed to reduce the deterioration of transistor, which also affects the yield rate of display panel. In view of the above, it is an important issue in the field of μLED to find out how to achieve a design that reduces deterioration of transistor in the μLED display panel and improves yield rate of the μLED display panel.

SUMMARY OF THE DISCLOSURE

The disclosure provides a display panel capable of reducing deterioration of transistor in display panel and improving yield rate of display panel.

A display panel of the disclosure includes a substrate and a plurality of display dies. The display die is disposed on the substrate and respectively has at least one pixel circuit, wherein the pixel circuit is respectively disposed in a circuit region and respectively includes a first source pad, a second source pad, at least one first common pad, at least one second common pad, a first gate pad, a second gate pad, a first transistor, a first light emitting diode (LED) and a second LED. The first source pad is disposed on a first side of the corresponding circuit region. The second source pad is disposed on a second side of the corresponding circuit region opposite to the first side and electrically connected to the first source pad. The first common pad is disposed on a third side of the corresponding circuit region. The second common pad is disposed on a fourth side of the corresponding circuit region opposite to the third side and electrically connected to the first common pad. The first gate pad is disposed on the third side of the corresponding circuit region. The second gate pad is disposed on the fourth side of the corresponding circuit region. The first transistor has a first end, a control end electrically connected to the first gate pad, and a second end electrically connected to the corresponding first common pad. The first LED is electrically connected between the first source pad and the first end of the first transistor in a forward direction. The second LED is electrically connected between the first source pad and the first end of the first transistor in a reverse direction, wherein the first LED and the second LED are configured to provide a first color light.

Based on the above, the display panel in the embodiment of the disclosure is designed by forming a pixel circuit having LED connected in forward/reverse direction in the display die to reduce the times of transferring element, thereby improving yield rate of display panel and reducing deterioration of transistor.

In order to make the aforementioned features and advantages of the disclosure more comprehensible, embodiments accompanying figures are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

Figure 1:
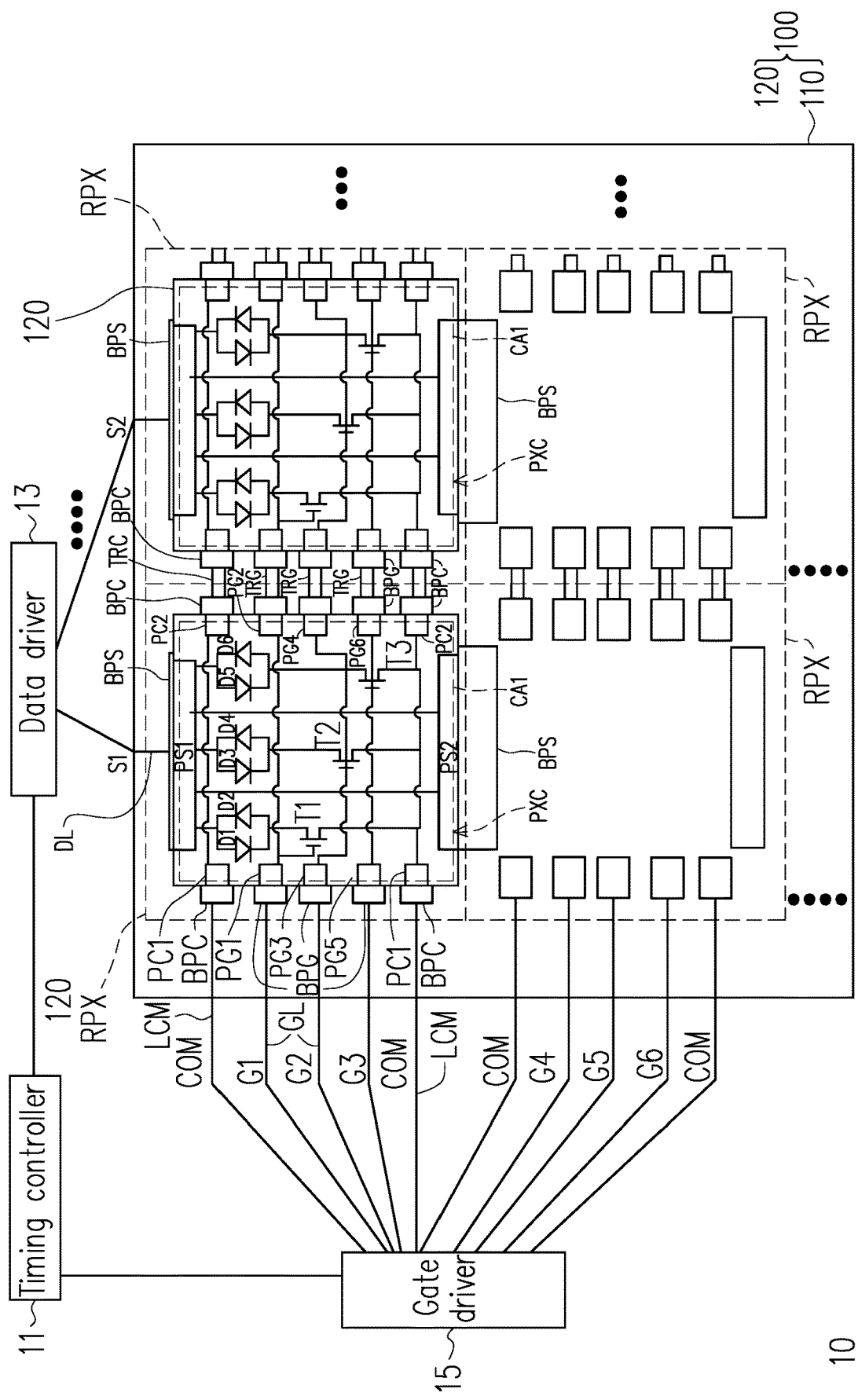
FIG. 1 is a system diagram of a display device according to an embodiment of the disclosure.

FIG. 1 is a system diagram of a display device according to an embodiment of the disclosure. Referring to FIG. 1, in the embodiment, a display device 10 includes a timing controller 11, a data deriver 13, a gate driver 15 and a display panel 100. The data driver 13 is coupled to the timing controller 11 and the display panel 100 to be controlled by the timing controller 11 and provide a plurality of source signals (e.g., S1, S2) to the display panel 100. The gate driver 15 is coupled to the timing controller 11 and the display panel 100 to be controlled by the timing controller 11 and provide a plurality of gate signals (e.g., G1-G6) to the display panel 100, wherein a common voltage COM described here is provided by the gate deriver 15 but may be provided by other circuit, such as a control circuit or a power circuit, in other embodiments, the disclosure provides no limitation thereto.

The display panel 100 includes a substrate 110 and a plurality of display dies 120, wherein the substrate 110 has a plurality of pixel regions RPX arranged in arrays, and configured to transfer (or be provided with) a corresponding display die 120; that is, the display die 120 is disposed on the substrate 110 in arrays. Moreover, the substrate 110 may be provided with a gate line GL electrically connected to the gate driver 15, a common voltage line LCM electrically connected to the gate driver 15, and a source line DL electrically connected to the data driver 13, wherein the gate line GL is configured to receive a gate signal (e.g., G1-G6), the source line DL is configured to receive a source signal (e.g., S1, S2) and the common voltage line LCM is configured to receive a common voltage COM. In the embodiment, each of the display dies 120 has a pixel circuit PXC, and the pixel circuit PXC is disposed in a circuit region CA1.

The pixel circuit PXC includes a first source pad PS1, a second source pad PS2, two first common pads PC1, two second common pads PC2, a first gate pad PG1, a second gate pad PG2, a third gate pad PG3, a fourth gate pad PG4, a fifth gate pad PG5, a sixth gate pad PG6, a first transistor T1, a second transistor T2, a third transistor T3, a first light emitting diode (LED) D1, a second LED D2, a third LED D3, a fourth LED D4, a fifth LED D5 and a sixth LED D6.

The first source pad PS1 is disposed on a first side of the corresponding circuit region CA1 (exemplified as the upper side in the drawing). The second source pad PS2 is disposed on a second side (exemplified as the lower side in the drawing) of the corresponding circuit region CA1 opposite to the first side, and electrically connected to the first source pad PS1 through wiring. Two first common pads PC1, the first gate pad PG1, the third gate pad PG3, the fifth gate pad PG5 are disposed on a third side (exemplified as the left side in the drawing) of the corresponding circuit region CA1.

The two second common pads PC2, the second gate pad PG2, the fourth gate pad PG4, the sixth gate pad PG6 are disposed on a fourth side (exemplified as the left side in the drawing) of the corresponding circuit region CA1 opposite to the third side. The two second common pads PC2 are electrically connected to the corresponding first common pads PC1 respectively through wiring. The second gate pad PG2 is electrically connected to the first gate pad PG1 through wiring. The fourth gate pad PG4 is electrically connected to the third gate pad PG3 through wiring. The sixth gate pad PG6 is electrically connected to the fifth gate pad PG5 through wiring.

The first transistor T1 has a first end, a control end electrically connected to the first gate pad PG1 and a second end electrically connected to the corresponding first common pads PC1. The first LED D1 is electrically connected between the first source pad PS1 and the first transistor T1 in a forward direction, that is, the anode of the first LED D1 is electrically connected to the first source pad PS1, and the cathode of the first LED D1 is electrically connected to the first end of the first transistor T1. The second LED D2 is electrically connected between the first source pad PS1 and the first end of the first transistor T1 in a reverse direction, that is, the cathode of the second LED D2 is electrically connected to the first source pad PS1, and the anode of the second LED D2 is electrically connected to the first end of the first transistor T1. The first LED D1 and the second LED D2 are configured to provide a first color light (exemplified as red color herein).

The second transistor T2 has a first end, a control end electrically connected to the third gate pad PG3 and a second end electrically connected to the corresponding first common pads PC1. The third LED D3 is electrically connected between the first source pad PS1 and the first end of the second transistor T2 in a forward direction, that is, the anode of the third LED D3 is electrically connected to the first source pad PS1, and the cathode of the third LED D3 is electrically connected to the first end of the second transistor T2. The fourth LED D4 is electrically connected between the first source pad PS1 and the first end of the second transistor T2 in a reverse direction, that is, the cathode of the fourth LED D4 is electrically connected to the first source pad PS1, and the anode of the fourth LED D4 is electrically connected to the first end of the second transistor T2. The third LED D3 and the fourth LED D4 are configured to provide a second color light (exemplified as green color herein) different from first color light.

The third transistor T3 has a first end, a control end electrically connected to the fifth gate pad PG5, and a second end electrically connected to the corresponding first common pads PC1. The fifth LED D5 is electrically connected between the first source pad PS1 and the first end of the third transistor T3 in a forward direction, that is, the anode of the fifth LED D5 is electrically connected to the first source pad PS1, and the cathode of the fifth LED D5 is electrically connected to the first end of the third transistor T3. The sixth LED D6 is electrically connected between the first source pad PS1 and the first end of the third transistor T3 in a reverse direction, that is, the cathode of the sixth LED D6 is electrically connected to the first source pad PS1, and the anode of the sixth LED D6 is electrically connected to the first end of the third transistor T3. The fifth LED D5 and the sixth LED D6 are configured to provide a third color light (exemplified as blue color herein) different from the first color light and the second color light.

In the pixel region RPX, the substrate 110 is provided with a source connection pad BPS, a gate connection pad BPG, a common connection pad BPC, a gate connection line TRG and a common connection line TRC, wherein the source connection pad BPS, the gate connection pad BPG, the common connection pad BPC, the gate connection line TRG and the common connection line TRC are formed of a single metal layer, that is, the source connection pad BPS, the gate connection pad BPG, the common connection pad BPC, the gate connection line TRG and the common connection line TRC are projected to a region on the substrate 110 without overlapping each other.

Take the direction shown in drawing as an example. The source connection pad BPS is configured to electrically connect the second source pad PS2 of each of the display dies 120 to the first source pad PS1 of the vertically adjacent display die 120. However, the source connection pad BPS in the pixel region RPX on the upper-most side of the substrate 110 is electrically connected to the source line DL and only mounted with the first source pad PS1; the source connection pad BPS in the pixel region RPX on the lower-most side of the substrate 110 is only mounted with the second source pad PS2. In other words, the first source pad PS1 of the display die 120 is electrically connected to the data driver 13 through the source line DL.

The gate connection pad BPG is configured to be respectively mounted with one of the first gate pad PG1, the second gate pad PG2, the third gate pad PG3, the fourth gate pad PG4, the fifth gate pad PG5 and the sixth gate pad PG6. Moreover, take the direction shown in the drawing as an example. The gate connection pad BPG in the pixel region RPX on the left-most side of the substrate 110 is further electrically connected to the gate line GL, that is, the first gate pad PG1, the second gate pad PG2, the third gate pad PG3, the fourth gate pad PG4, the fifth gate pad PG5 and the sixth gate pad PG6 of the display die 120 are electrically connected to the gate driver 15 through the gate line GL. The common connection pad BPC is configured to be respectively mounted with one of the first common pads PC1 and the second common pads PC2. Moreover, take the direction shown in the drawing as an example. The common connection pad BPC in the pixel region RPX on the left-most side of the substrate 110 is further electrically connected to the common voltage line LCM.

Take the direction shown in the drawing as an example. The gate connection line TRG is electrically connected to two neighboring gate connection pads BPG respectively in the horizontally adjacent pixel region RPX, that is, the gate connection line TRG is configured to electrically connect the first gate pad PG1, the third connection pad PG3 and the fifth gate pad PG5 of each of the display dies 120 respectively to the second gate pad PG2, the fourth gate pad PG4 and the sixth gate pad PG6 of the horizontally adjacent display die 120.

Take the direction shown in the drawing as an example. The common connection line TRC is electrically connected to two neighboring gate connection pads BPG respectively in the horizontally adjacent pixel region RPX, that is, the common connection line TRC is configured to electrically connect the first common pads PC1 of each of the display dies 120 to the second common pads PC2 of the horizontally adjacent display die 120 respectively.

In the embodiment, the first transistor T1, the second transistor T2 and the third transistor T3 are metal-oxide-semiconductor field-effect transistors (MOSFET) respectively. Furthermore, the first gate pad PG1, the third gate PG3 and the fifth gate pad PG5 are disposed between the first common pads PC1, and the first gate pad PG1, the third gate pad PG3, the fifth gate pad PG5 and the first common pads PC1 are uniformly distributed on the third side (e.g., left side in the drawing) of the corresponding circuit region CA1. The second gate pad PG2, the fourth gate pad PG4 and the sixth gate pad PG6 are disposed between the second common pads PC2, and the second gate pad PG2, the fourth gate pad PG4, the sixth gate pad PG6 and the second common pads PC2 are uniformly distributed on the fourth side (e.g., right side in the drawing) of the corresponding circuit region CA1.

Figure 2:
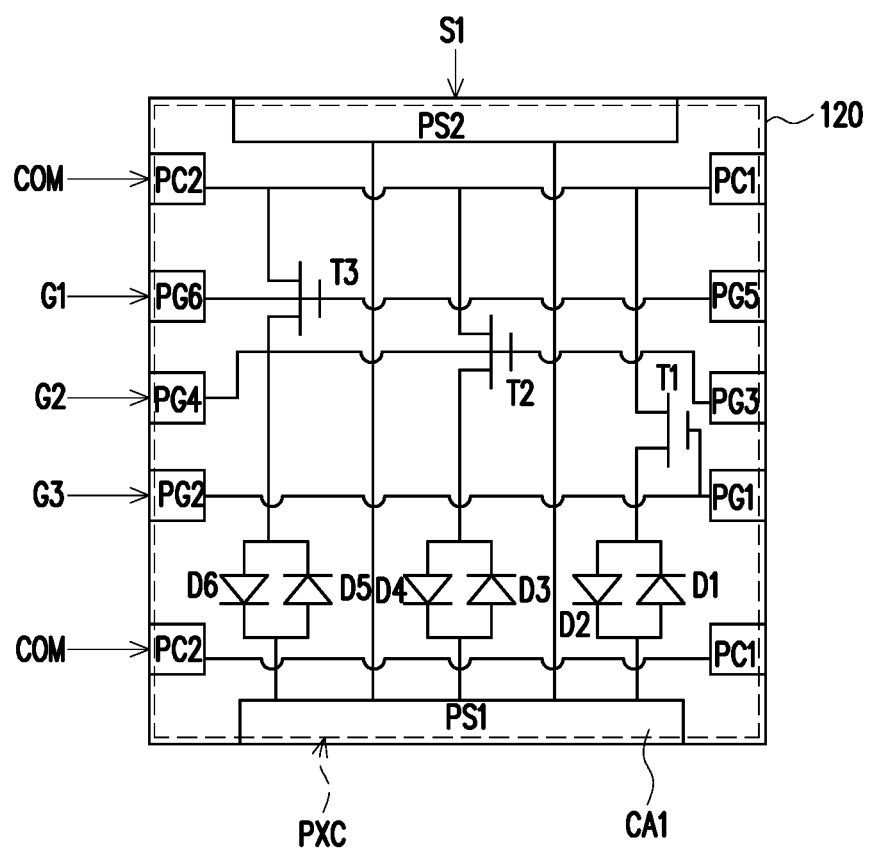
FIG. 2 is a schematic view of a display die connected in reverse direction according to an embodiment of the disclosure.

FIG. 2 is a schematic view of a display die connected in reverse direction according to an embodiment of the disclosure. Referring to FIG. 1 and FIG. 2, similar or identical elements are represented by similar or identical reference numerals. In the embodiment of FIG. 1, when the display die 120 is normally connected, the first gate pad PG1, the third gate pad PG3 and the fifth gate pad PG5 respectively receive gate signals G1-G3, that is, the first transistor T1, the second transistor T2 and the third transistor T3 are respectively controlled by the gate signals G1-G3. In contrast, in the embodiment, when the display die 120 is reversely connected, the sixth gate pad PG6, the fourth gate pad PG4 and the second gate pad PG2 respectively receive the gate signals G1-G3, that is, the first transistor T1, the second transistor T2 and the third transistor T3 are respectively controlled by the gate signals G3-G1.

In other words, the display die 120 can be normally driven no matter it is normally or reversely connected, but the light emitting sequence of the display die 120 being normally connected is different from the light emitting sequence of the display die 120 being reversely connected.

Figure 3:
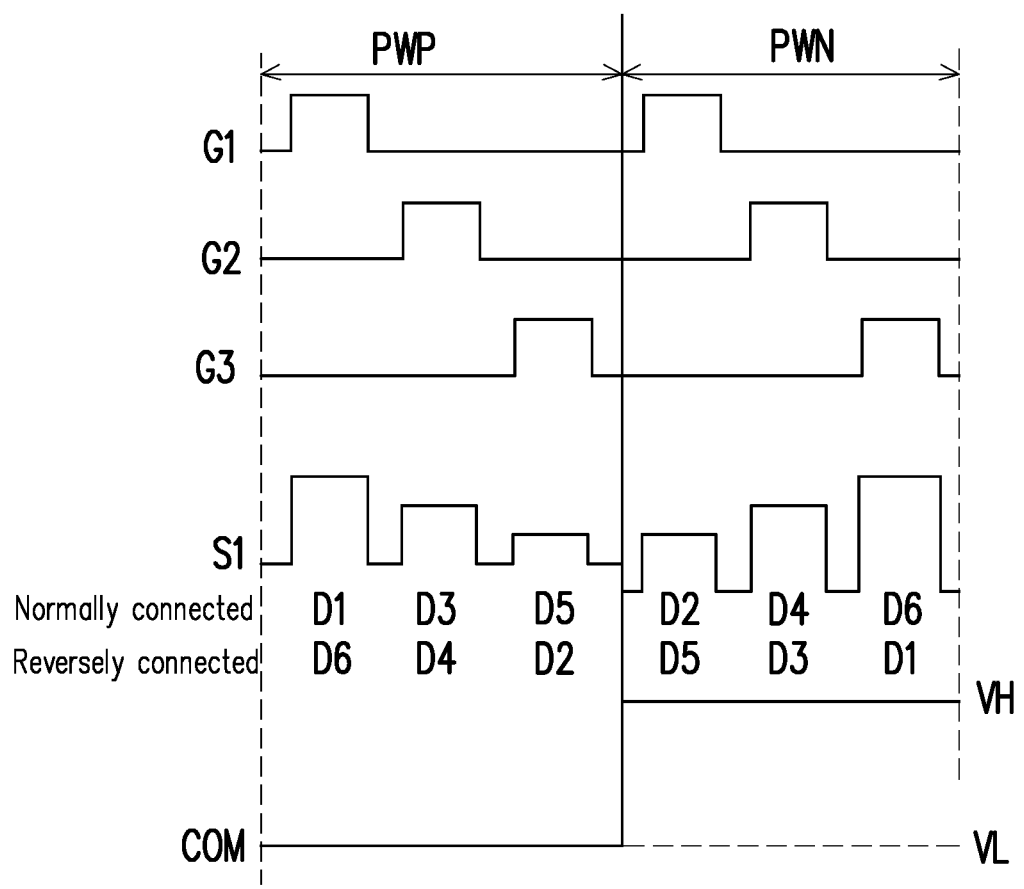
FIG. 3 is a schematic diagram showing driving waveform of a display die according to an embodiment of the disclosure.

FIG. 3 is a schematic diagram showing driving waveform of a display die according to an embodiment of the disclosure. Referring to FIG. 1 to FIG. 3, in the embodiment, when the display panel 100 are in a positive driving period PWP, the display die, for example, receives sequentially enabled gate signals G1-G3, and the common voltage COM is low voltage level VL. At this time, when the display die 120 is normally connected, the first LED D1, the third LED D3 and the fifth LED D5 are lighted in order. In contrast, when the display die 120 is reversely connected, the sixth LED D6, the fourth LED D4 and the second LED D2 are lighted in order.

When the display panel 100 is in a negative driving period PWN, the display die similarly, for example, receives sequentially enabled gate signals G1-G3, and the common voltage COM is high voltage level VH. At this time, when the display die 120 is normally connected, the second LED D2, the fourth LED D4 and the sixth LED D6 are lighted in order. In contrast, when the display die 120 is reversely connected, the fifth LED D5, the third LED D3 and the first LED D1 are lighted in order.

Based on the above, since the display die 120 has different light emitting sequences when being normally or reversely connected, after the display die 120 is transferred (or disposed) on the substrate 110, a test pattern may be written in or driven normally for one time, such that the light emitting condition of the display panel 100 is used to determine whether each of the display dies 120 is normally or reversely connected. Meanwhile, based on the corresponding table established in the timing controller 11 under the condition that the display die 120 is normally or reversely connected, the timing controller 11 may control the source signal (e.g., S1, S2) provided by the data driver 13 to provide correct voltage level, thereby accurately driving the first LED D1, the second LED D2, the third LED D3, the fourth LED D4, the fifth LED D5 and the sixth LED D6 of each of the display dies 120.

Figure 4:
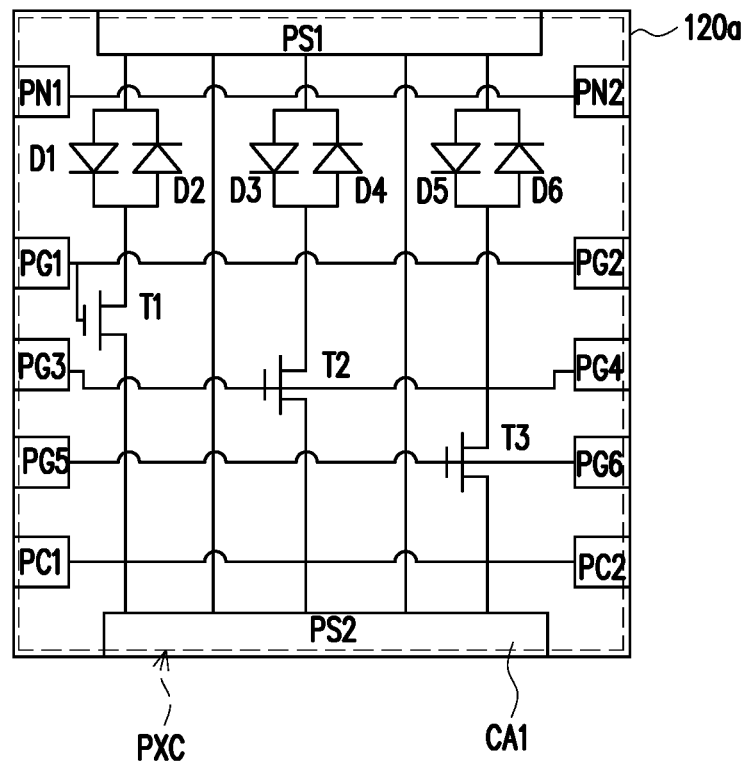
FIG. 4 is a schematic view of an empty pad of a display die according to an embodiment of the disclosure.

FIG. 4 is a schematic view of an empty pad of a display die according to an embodiment of the disclosure. Referring to FIG. 1 and FIG. 4, a display die 120a is substantially identical to the display die 120, wherein identical or similar elements are represented by the same or similar reference numerals. In the embodiment, the pad that does not receive signal may be defined as an empty pad. Specifically, a first empty pad PN1 is disposed on the third side (exemplified as left side in the drawing) of the corresponding circuit region CA1, a second empty pad PN2 is disposed on the fourth side (exemplified as right side in the drawing) of the corresponding circuit region CA1, and the second empty pad PN2 is electrically connected to the first empty pad PN1 through wiring.

Furthermore, herein, the number of the first common pad PC1 and the first empty pad PN1 are one, and the first gate pad PG1, the third gate pad PG3 and the fifth gate pad PG5 are disposed between the first common pad PC1 and the first empty pad PN1. The first gate pad PG1, the third gate pad PG3, the fifth gate pad PG5, the first common pad PC1 and the first empty pad PN1 may be uniformly distributed on the third side (exemplified as left side in the drawing) of the corresponding circuit region CA1.

Herein, the number of the second common pad PC2 and the second empty pad PN2 is one, and the second gate pad PG2, the fourth gate pad PG4 and the sixth gate pad PG6 are disposed between the second common pad PC2 and the second empty pad PN2. The second gate pad PG2, the fourth gate pad PG4, the sixth gate pad PG6, the second common pad PC2 and the second empty pad PN2 may be uniformly distributed on the fourth side (exemplified as right side in the drawing) of the corresponding circuit region CA2.

In the embodiment, the first empty pad PN1 and the second empty pad PN2 are configured to transmit (or bypass) a signal irrelevant to the corresponding pixel circuit PXC to the horizontally adjacent pixel circuit PXC, and the number and position of the first empty pad PN1 and the second empty pad PN2 may be set based on the actual circuit design, the disclosure provides no limitation thereto.

Figure 5:
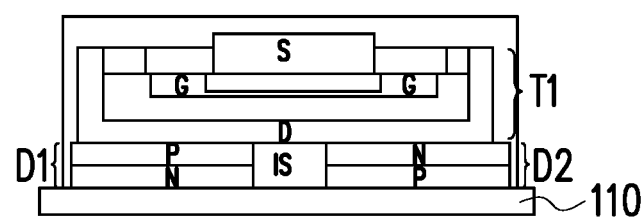
FIG. 5 is a structural diagram of a transistor and a light emitting diode (LED) according to an embodiment of the disclosure.

FIG. 5 is a structural diagram of a transistor and a light emitting diode (LED) according to an embodiment of the disclosure. Referring to FIG. 1 and FIG. 5, the embodiment is exemplified with the structures of the first LED D1, the second LED D2, and the first transistor T1. For example, a PN structure of the first LED D1 may be formed on the substrate 110 first, then an insulating layer IS is formed next and finally an NP structure of the second LED D2 is formed. After the structures of the first LED D1 and the second LED D2 are formed, the drain D of the first transistor T1 may be bonded to the first LED D1 and the second LED D2 through any type of mounting techniques, wherein the voltage level of the gate G of the first transistor T1 affects the degree of conductivity between the drain D and source S of the first transistor T1.

Figure 6:
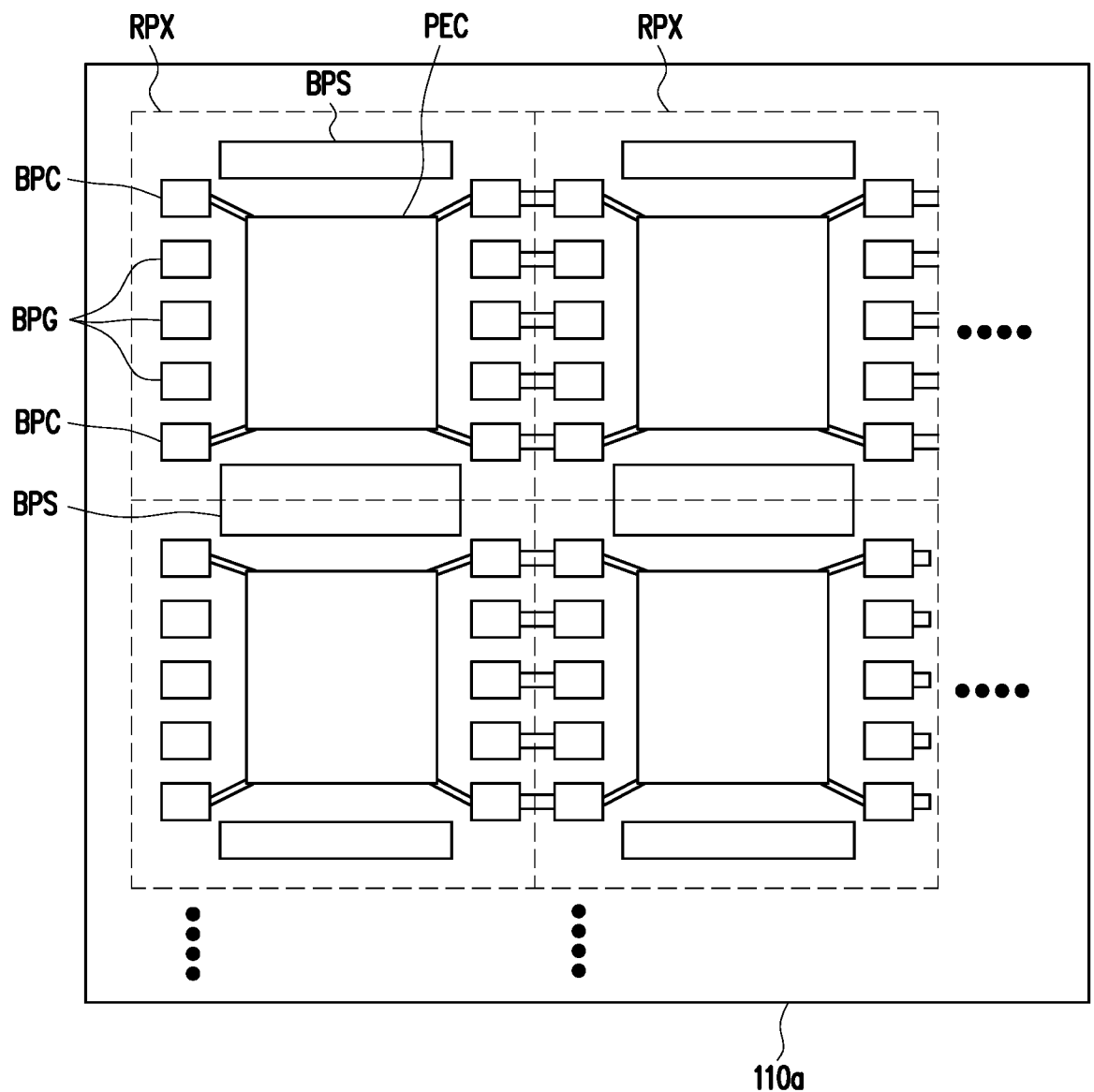
FIG. 6 is a circuit diagram of a substrate according to another embodiment of the disclosure.

FIG. 6 is a circuit diagram of a substrate according to another embodiment of the disclosure. Referring to FIG. 1 and FIG. 6, a substrate 110a is substantially the same as the substrate 110, and the difference between the two is that the substrate 110a is further provided with a plurality of common plane electrodes PEC, wherein identical or similar elements are represented by identical or similar reference numerals. In the embodiment, the common plane electrodes PEC are respectively disposed in the corresponding pixel region RPX, and disposed between the source connection pad BPS, the gate connection pad BPG, the common connection pad BPC and the gate connection line TRG. However, the common electrode PEC is only electrically connected to the common connection pad BPC, that is, only electrically connected to the first common pad PC1 and the second common pad PC2 and configured to transmit common voltage COM. Herein, with the use of common electrode PEC, the lines can be connected more easily, and faster heat-dissipation of the display die 120 can be achieved.

Figure 7:
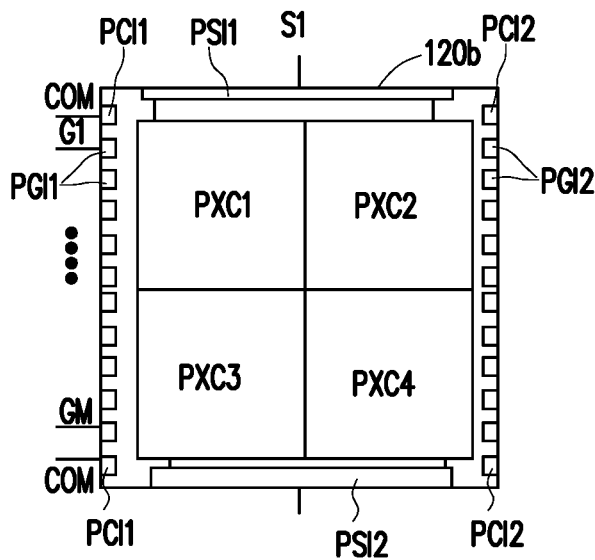
FIG. 7 is a circuit diagram of a display die according to still another embodiment of the disclosure.

FIG. 7 is a circuit diagram of a display die according to still another embodiment of the disclosure. Referring to FIG. 1 and FIG. 7, in the embodiment, a display die 120b has a plurality of pixel circuits (four pixel circuits PXC1-PXC4 are exemplified in the embodiment) arranged in arrays, wherein the pixel circuit PXC may serve as reference for the pixel circuits PXC1-PXC4. In the embodiment, the display die 120b further includes a first source interface pad PSI1, a second source interface pad PSI2, two first common interface pads PCI1, two second common interface pads PCI2, a plurality of first gate interface pads PGI1 and a plurality of second gate interface pads PGI2. Specifically, the number of the first common interface pad PCI1 and the second common interface pad PCI2 may be set to be one or more.

The first source interface pad PSI1 is disposed on the first side (exemplified as upper side in the drawing) of the corresponding display die 120b, configured to receive the corresponding source signal (e.g., S1), and electrically connected to the first source pad PS1 adjacent to the first side of the display die 120b in the pixel circuits (e.g., PXC1-PXC4). The second source interface pad PSI2 is disposed on the second side (exemplified as lower side in the drawing) of the corresponding display die 120b opposite to the first side, and electrically connected to the second source pad PS2 adjacent to the second side of the display die 120b in the pixel circuits (e.g., PXC1-PXC4). The second source interface pad PSI2 is electrically connected to the first source interface pad PSI1 through the pixel circuits (e.g., PXC1-PXC4) and configured to transmit the corresponding source signal (e.g., S1).

The first common interface pad PCI1 is disposed on the third side (exemplified as left side in the drawing) of the corresponding display die 120b and electrically connected to the first common pad PC1 adjacent to the third side of the display die 120b in the pixel circuits (e.g., PXC1-PXC4). The second common interface pad PCI2 is disposed on the fourth side (exemplified as right side in the drawing) of the corresponding display die 120b opposite to the third side, and electrically connected to the second common pad PC2 adjacent to the fourth side of the display die 120b in the pixel circuits (e.g., PXC1-PXC4). The first common interface pad PCI1 is configured to receive the common voltage COM, and the second common interface pad PCI2 is electrically connected to the first common interface pad PCI1 through the pixel circuits (e.g., PXC1-PXC4) and configured to transmit the common voltage COM.

The first gate interface pad PGI1 is disposed on the third side of the corresponding display die 120b, disposed between the first common interface pads PCI1 and electrically connected to the first gate pad PG1, the third gate pad PG3 and the fifth gate pad PG5 adjacent to the third side of the display die in the pixel circuits (e.g., PXC1-PXC4). The second gate interface pad PGI2 is disposed on the fourth side of the corresponding display die 120b, disposed between the second common interface pads PC2 and electrically connected to the second gate pad PG2, the fourth gate pad PG4 and the sixth gate pad PG6 adjacent to the fourth side of the display die in the pixel circuits (e.g., PXC1-PXC4). The first gate interface pads PGI1 are configured to receive the gate signals (e.g., G1-GM, M is positive integer), and the second gate interface pads PGI2 are electrically connected to the first gate interface pads PGI1 through pixel circuits (e.g., PXC1-PXC4) and configured to transmit the gate signals (e.g., G1-GM).

In the embodiment of the disclosure, when the pixel circuits (e.g., PXC1-PXC4) are driven row by row, that is, the pixel circuits PXC1 and PXC2 are driven simultaneously, the pixel circuits PXC3 and PXC4 are driven simultaneously, then the number of the first gate interface pad PGI1 and the second gate interface pad PGI2 is equal to the number of rows of the array formed by the pixel circuits (e.g., PXC1-PXC4) multiplied by the number of the light-emitting color of each of the pixel circuits (e.g., PXC1-PXC4). At this time, the number of the first source interface pad PSI1 is equal to the number of columns of the array formed by the pixel circuits (e.g., PXC1-PXC4).

In the embodiments of the disclosure, when the pixel circuits (e.g., PXC1-PXC4) are driven per by per, that is, the pixel circuits PXC1-PXC4 are driven in order, the number of the first gate interface pad PGI1 and the second gate interface pad PGI2 is equal to the number of the pixel circuits (e.g., PXC1-PXC4) multiplied by the number of the light-emitting color of each of the pixel circuits (e.g., PXC1-PXC4). At this time, the number of the first source interface pad PSI1 is one, and each of the pixel circuits (e.g., PXC1-PXC4) may be provided with the first empty pad PN1 and the second empty pad PN2 shown in FIG. 4 to transmit the gate signal (e.g., G1-GM) used by the horizontally adjacent pixel circuits (e.g., PXC1-PXC4).

Figure 8:
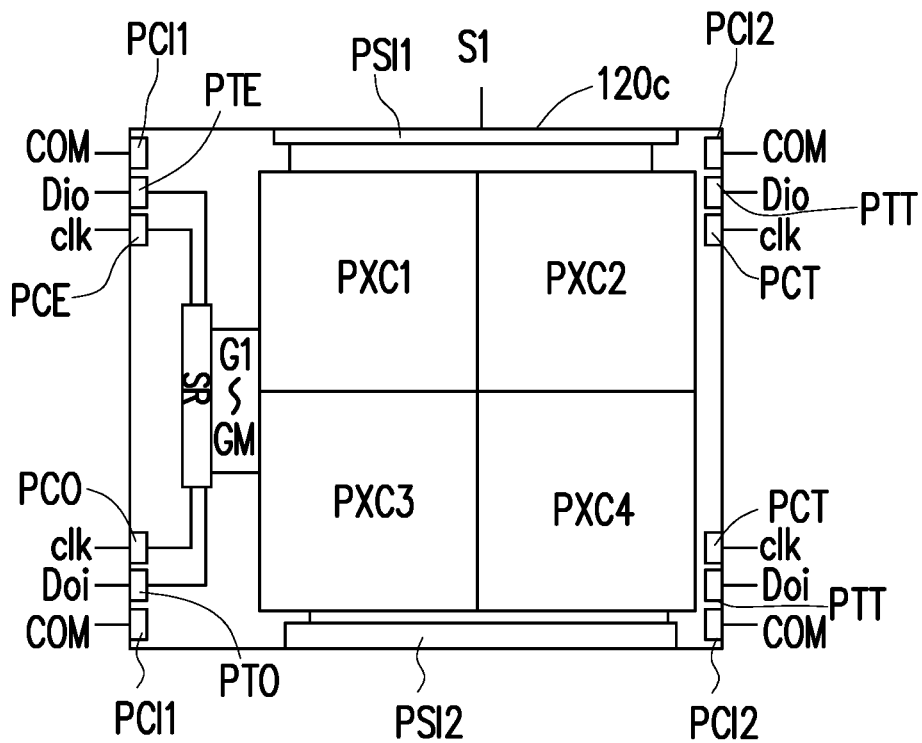
FIG. 8 is a circuit diagram of a display die according to yet another embodiment of the disclosure.

FIG. 8 is a circuit diagram of a display die according to yet another embodiment of the disclosure. Referring to FIG. 1, FIG. 7 and FIG. 8, in the embodiment, a display die 120c is substantially the same as the display die 120b, and the difference between the two is that a trigger input pad PTE, a clock input pad PCE, a trigger output pad PTO and a clock output pad PCO are used to replace the first gate interface pad PGI1, and two sets of trigger transmitting pads PTT and clock transmitting pads PCT are used to replace the second gate interface pad PGI2, wherein the trigger transmitting pads PTT and the clock transmitting pads PCT may be reduced as one set according to the circuit design. In the embodiment, the display die 120c is further provided with a shift register SR electrically connected to the first gate pad PG1 adjacent to the third side (exemplified as left side in the drawing) of the display die 120c in the pixel circuits (e.g., PXC1-PXC4).

The trigger input pad PTE is disposed on the third side of the corresponding display die 120c and electrically connected to the trigger input end of the shift register SR, thereby transmitting a start trigger signal Dio to the shift register SR. The trigger output pad PTO is disposed on the third side of the corresponding display die 120c and electrically connected to the trigger output end of the shift register SR, thereby outputting a subsequent trigger signal Doi from the shift register SR.

The clock input pad PCE is disposed on the third side of the corresponding display die 120c, and electrically connected to the clock input end of the shift register SR, thereby transmitting a clock signal clk to the shift register SR. The clock output pad PCO is disposed on the third side of the corresponding display die 120c and electrically connected to the clock output end of the shift register SR, thereby outputting the clock signal clk from the shift register SR.

The trigger transmitting pad PTT is disposed on the fourth side (exemplified as right side in the drawing) of the corresponding display die 120c, and may be electrically connected to the trigger input pad PTE and the trigger output pad PTO respectively through wiring, thereby outputting the start trigger signal Dio and the subsequent trigger signal Doi respectively. The clock transmitting pad PCT is disposed on the fourth side of the corresponding display die 120c, and may be electrically connected to the clock input pad PCE and the clock output pad PCO respectively through wiring, thereby outputting the clock signal clk respectively.

In summary, the display panel in the embodiment of the disclosure is designed by forming the pixel circuit having LED connected in forward/reverse direction in the display die to reduce the times of transferring element, thereby improving yield rate of display panel and reducing deterioration of transistor.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
    a substrate; and
    a plurality of display dies, disposed on the substrate, and respectively having at least one pixel circuit, wherein the at least one pixel circuit is respectively disposed in a circuit region and the at least one pixel circuit respectively comprises:
        a first source pad, disposed on a first side of the corresponding circuit region;
        a second source pad, disposed on a second side of the corresponding circuit region opposite to the first side, and electrically connected to the first source pad;
        at least one first common pad, disposed on a third side of the corresponding circuit region;
        at least one second common pad, disposed on a fourth side of the corresponding circuit region opposite to the third side, and electrically connected to the at least one first common pad;
        a first gate pad, disposed on the third side of the corresponding circuit region;
        a second gate pad, disposed on the fourth side of the corresponding circuit region;
        a first transistor, having a first end, a control end electrically connected to the first gate pad, and a second end electrically connected to the corresponding first common pad;
        a first light emitting diode (LED), electrically connected between the first source pad and the first end of the first transistor in a forward direction; and
        a second LED, electrically connected between the first source pad and the first end of the first transistor in a reverse direction, wherein the first LED and the second LED are configured to provide a first color light.

2. The display panel according to claim 1, wherein the at least one pixel circuit further respectively comprises:
    a third gate pad, disposed on the third side of the corresponding circuit region;
    a fourth gate pad, disposed on the fourth side of the corresponding circuit region;
    a second transistor, having a first end, a control end electrically connected to the third gate pad, and a second end electrically connected to the corresponding first common pad;
    a third LED, electrically connected between the first source pad and the first end of the second transistor in a forward direction; and
    a fourth LED, electrically connected between the first source pad and the first end of the second transistor in a reverse direction, wherein the third LED and the fourth LED are configured to provide a second color light different from the first color light.

3. The display panel according to claim 2, wherein the at least one pixel circuit further respectively comprises:
    a fifth gate pad, disposed on the third side of the corresponding circuit region;
    a sixth gate pad, disposed on the fourth side of the corresponding circuit region;
    a third transistor, having a first end, a control end electrically connected to the fifth gate pad, and a second end electrically connected to the corresponding first common pad;
    a fifth LED, electrically connected between the first source pad and the first end of the third transistor in a forward direction; and
    a sixth LED, electrically connected between the first source pad and the first end of the third transistor in a reverse direction, wherein the fifth LED and the sixth LED are configured to provide a third color light different from the first color light and the second color light.

4. The display panel according to claim 3, wherein the substrate is provided with a plurality of source connection pads and a plurality of gate connection lines, wherein the source connection pads electrically connect the second source pad of each of the display dies to the first source pad of the adjacent display die, and the gate connection lines electrically connect the first gate pad, the third gate pad and the fifth gate pad of each of the display dies respectively to the second gate pad, the fourth gate pad and the sixth gate pad of the adjacent display die.

5. The display panel according to claim 4, wherein the source connection pads and the gate connection lines are formed of a single metal layer.

6. The display panel according to claim 3, wherein the first transistor, the second transistor and the third transistor are metal-oxide-semiconductor field-effect transistors respectively.

7. The display panel according to claim 3, wherein the number of the at least one common pad is one, the first gate pad, the third gate pad and the fifth gate pad are disposed between the first common pad and a first empty pad, and the first gate pad, the third gate pad, the fifth gate pad, the first common pad and the first empty pad are uniformly distributed on the third side of the corresponding circuit region.

8. The display panel according to claim 7, wherein the number of the at least one second common pad is one, the second gate pad, the fourth gate pad and the sixth gate pad are disposed between the second common pad and a second empty pad, and the second gate pad, the fourth gate pad and the sixth gate pad, the second common pad and the second empty pad are uniformly distributed on the corresponding fourth side of the corresponding circuit region, wherein the second empty pad is electrically connected to the first empty pad.

9. The display panel according to claim 1, wherein the substrate is provided with a plurality of common plane electrodes, configured to be electrically connected to the at least one first common pad and the at least one second common pad of the corresponding display die respectively.

10. The display panel according to claim 1, wherein when each of the display dies has a plurality of pixel circuits arranged in array, each of the display dies further comprises:
    at least one first source interface pad, disposed on a first side of each of the display dies, electrically connected to the first source pads adjacent to the first side of the display die in the pixel circuits;
    at least one second source interface pad, disposed on a second side of each of the display dies opposite to the first side, electrically connected to the second source pads adjacent to the second side of the display die in the pixel circuits;
    at least one first common interface pad, disposed on a third side of each of the display dies, electrically connected to the first common pads adjacent to the third side of the display die in the pixel circuits;
    at least one second common interface pad, disposed on a fourth side of each of the display dies opposite to the third side, electrically connected to the second common pads adjacent to the fourth side of the display die in the pixel circuits;
    a plurality of first gate interface pads, disposed on the third side of each of the display dies, electrically connected to the first gate pads adjacent to the third side of the display die in the pixel circuits; and
    a plurality of second gate interface pads, disposed on the fourth side of each of the display dies, electrically connected to the second gate pads adjacent to the fourth side of the display die in the pixel circuits.

11. The display panel according to claim 1, wherein when each of the display dies has a plurality of pixel circuits arranged in array, each of the display dies further comprises:
    at least one first source interface pad, disposed on a first side of each of the display dies, electrically connected to the first source pads adjacent to the first side of the display die in the pixel circuits;
    at least one second source interface pad, disposed on a second side of each of the display dies opposite to the first side, electrically connected to the second source pads adjacent to the second side of the display die in the pixel circuits;
    at least one first common interface pad, disposed on a third side of each of the display dies, electrically connected to the first common pads adjacent to the third side of the display die in the pixel circuits;
    at least one second common interface pad, disposed on a fourth side of each of the display dies opposite to the third side, electrically connected to the second common pads adjacent to the fourth side of the display die in the pixel circuits;
    a shift register, electrically connected to the first gate pads adjacent to the third side of the display die in the pixel circuits;
    a trigger input pad, disposed on the third side of each of the display dies, and electrically connected to a trigger input end of the shift register;
    a trigger output pad, disposed on the third side of each of the display dies, and electrically connected to a trigger output end of the shift register;
    a clock input pad, disposed on the third side of each of the display dies, and electrically connected to a clock input end of the shift register;
    a clock output pad, disposed on the third side of each of the display dies, and electrically connected to a clock output end of the shift register;
    at least one trigger transmitting pad, disposed on the fourth side of each of the display dies, and electrically connected to the trigger input pad; and
    at least one clock transmitting pad, disposed on the fourth side of each of the display dies, and electrically connected to the clock input pad.

12. The display panel according to claim 1, wherein the substrate is further provided with a plurality of source lines configured to electrically connect the display dies to a data driver.

13. The display panel according to claim 1, wherein the substrate is further provided with a plurality of gate lines configured to electrically connect the display dies to a gate driver.

14. The display panel according to claim 1, wherein the display dies are disposed on the substrate in array.

* * * * *